United States Patent [19]

Tamura

[11] Patent Number: 4,510,460

[45] Date of Patent: Apr. 9, 1985

[54] OUTPUT POWER CONTROL CIRCUIT FOR POWER AMPLIFIER

[75] Inventor: Yoshiharu Tamura, Tokyo, Japan

[73] Assignee: NEC Corporation, Tokyo, Japan

[21] Appl. No.: 553,708

[22] Filed: Nov. 21, 1983

[30] Foreign Application Priority Data

Nov. 25, 1982 [JP] Japan .................. 57-177244[U]

[51] Int. Cl.³ .............................................. H03G 3/30
[52] U.S. Cl. .................................. 330/285; 330/277; 330/286; 330/297
[58] Field of Search ............... 330/128, 202, 277, 285, 330/286, 297

[56] References Cited

U.S. PATENT DOCUMENTS 3,644,832  2/1972  Sherman, Jr. ............... 330/285 X

Primary Examiner—James B. Mullins
Attorney, Agent, or Firm—Laff, Whitesel, Conte & Saret

[57] ABSTRACT

An output power control circuit provided with a power amplifier circuit of an input amplifier and an output amplifier connected in series with the input amplifier, has: a first transistor having a first electrode connected to a direct current power supply and a second electrode connected to a power supply terminal of the output amplifier; a second transistor having a first electrode connected to a third electrode of the first transistor and a second electrode connected to a power supply terminal of the input amplifier; and at least one diode connected between the direct current power supply and the power supply terminal of the input amplifier.

8 Claims, 15 Drawing Figures

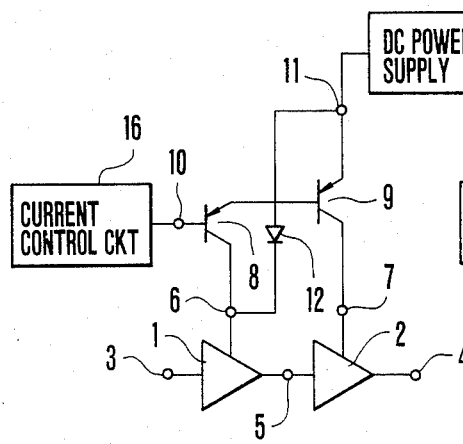
F I G. 7
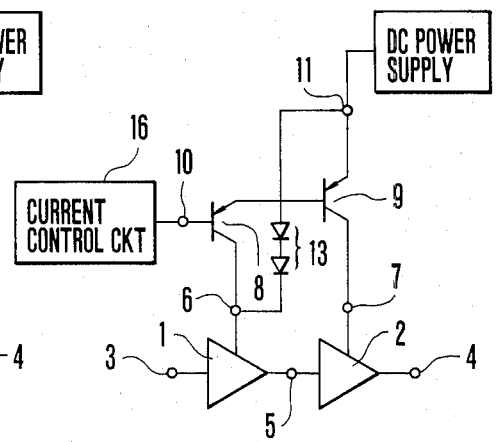
F I G. 8
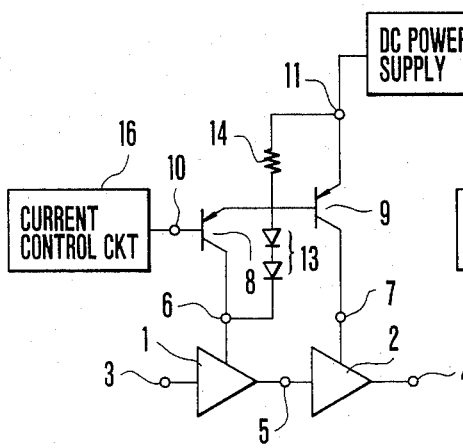
F I G. 9
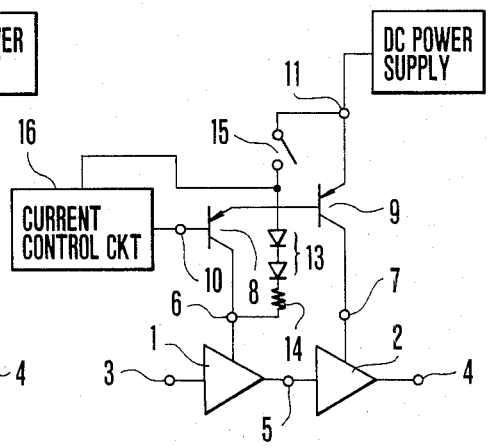
F I G. 10

OUTPUT POWER CONTROL CIRCUIT FOR POWER AMPLIFIER

BACKGROUND OF THE INVENTION

The present invention relates to an output power control circuit for a power amplifier circuit and, more particularly, to an output power control circuit for a power amplifier circuit which comprises an input amplifier and an output amplifier connected in series therewith.

Conventionally, there are various control methods for controlling the output power of power amplifiers: an input power control scheme; a power supply control scheme; a scheme for controlling constants of the amplifier circuit; and a scheme for directly controlling the output power with a variable attenuator. A proper control method is selected in consideration of various factors such as power, a power supply, a power efficiency, the type of amplifier element, and operating conditions. The present invention is based upon the power supply control scheme. In particular, a large DC current flows through the output amplifier of the power amplifier circuit even in the absence of input power.

The drawbacks of the conventional output power control circuits will be described with reference to FIGS. 1 to 4. Referring to FIGS. 1 to 4, reference numeral 1 denotes a preceding or input amplifier; 2, a succeeding or output amplifier through which a large current flows in the absence of input power; 3, an input terminal; 4, an output terminal; 5, a connecting point between the input amplifier 1 and the output amplifier 2; 6, a power supply terminal of the input amplifier 1; 7, a power supply terminal of the output amplifier 2; 8 and 9, power control transistors, respectively; 10, a control terminal; and 11, a DC power supply terminal. It should be noted that resistors for controlling the operating points of the control transistors 8 and 9 are omitted in FIGS. 1 to 4.

The power consumption of electronic equipment including a power amplifier is mainly determined by the power consumption of the power amplifier. In favor of low power consumption, a sum of power consumption of the power amplifier and that of the output power control circuit is preferably small, regardless of the coutput level. In the circuits shown in FIGS. 1 and 2, a control current of about 1/10 of a collector current of the transistor 9 or, a circuit current of the output amplifier must flow to the control terminal 10 so as to saturate the transistor 9 with a voltage drop due to a collector-emitter voltage $V_{CE}$ of the transistor 9 minimized when a maximum output is generated from the power amplifier circuit. This leads to an increase in current as a whole, thus degrading the efficiency of the entire circuit. However, when a Darlington amplifier is used as the transistor 9, it will do that a small current can flow to the control terminal 10. However, a voltage drop at the terminal 7 is great with the transistor 9 saturated, thereby decreasing the maximum output of the output amplifier 2 and hence resulting in inconvenience.

As described above, the output amplifier 2 comprises an amplifier through which a large current flows even in the absence of an input voltage. Assume that the output amplifier 2 serves as a complete class A amplifier. In this case, even if an input to the output amplifier 2 (i.e., the level at the connecting point 5) decreases and the output from the output amplifier 2 decreases, a DC current flowing through the output amplifier 2 will not change. It is otherwise assumed that the output amplifier 2 is operated such that a DC current flowing through the amplifier 2 upon delivery of a maximum output, i.e., upon reception of a large signal input is smaller than a current flow in the absence of an input signal. In this case, when the input decreases to decrease the output, the current increases and eventually becomes equal to that in the absence of an input signal. Conversely, when the amplifier is operated such that the current increases at the maximum output, the current initially decreases as the input decreases. However, when the amplifier is brought into a class A operation, the current eventually becomes steady, equalling the current in the absence of an input signal. In fine, when the input is controlled using the aforementioned output amplifier while the power supply voltage is kept constant, the efficiency is considerably degraded when the output is set to be greatly smaller than the maximum output.

The above drawback is illustrated in FIG. 5. Reference symbols $P_{IN}$, $P_{OUT}$, I and $\eta$ denote the input power, the output power, the DC current, and the power efficiency, respectively. Reference symbols a, b and c denote the aforementioned three operating states. Thus, the operating state a corresponds to the class A operating state, the operating state b corresponds to the state wherein the current decreases when a large input is received, and the operating state c corresponds to the state wherein the current increases when a large input is received. A power supply voltage $V_s$ is of course kept constant. In any one of these operating states, the folowing relations are given when the output is small corresponding to the input which is less than a level indicated by a dotted line d:

$$P_{OUT}=k_1 P_{IN}, I=k_2$$

$$\eta=(P_{OUT}-P_{IN})/V_s I=(k_1-1)P_{IN}/k_2 \quad (1)$$

where $k_1$ and $k_2$ are constants, indicating that when the input decreases, the efficiency decreases proportionately.

On the other hand, FIG. 6 shows graphs for explaining the electrical characteristics under condition that the power supply voltage changes when the input power is kept at the maximum output. As is apparent from the graphs, the following relations can be established by approximation in most of the operating range:

$$P_{OUT}=k_3 V_s^2, I=k_4 V_s$$

$$\eta=(P_{OUT}-P_{IN})/V_s I=k_3/k_4-P_{IN}/k_4 V_s^2 \quad (2)$$

where $k_3$ and $k_4$ are constants. When $k_4 V_s^2 > P_{IN}$ is established, the efficiency will remain unchanged. In other words, when the power supply voltage is changed while maintaining the input at a predetermined level, the output power control can be effected without degrading the efficiency even at a low output. When the power supply voltage is kept at a very low level, the second term cannot of course be neglected with respect to the first term in equation (2), resulting in a degraded efficiency as indicated by a curve e. However, even the degraded efficiency can be much improved over the case in FIG. 5.

Strictly speaking, a decrease in the input to the output amplifier 2 means a decrease in the output from the input amplifier 1. In this case, a current flowing through the input amplifier 1 decreases, so that both an increase in current through the output amplifier 2 and a decrease in current through the input amplifier 1 must be considered for determination of the entire current. If, as in the typical case, the power amplification factor of the input amplifier 1 is about 10 dB and the amplifiers 1 and 2 have the same power efficiency, the current flowing through the input amplifier 1 may be decreased to a fraction or 1/10 of the current of the output amplifier 2. Furthermore, a change in current of the output amplifier 2 is greater than that of the input amplifier 1. Under these conditions, in order not to degrade power efficiency at a low output level, it is most effective to change the power supply voltage of the output amplifier without decreasing the input supplied to the output amplifier below a given level.

From the viewpoint described above, the circuit arrangement shown in FIG. 3 is not preferable, as compared with the circuit arrangement shown in FIG. 2. However, the circuit shown in FIG. 2 presents the problem of the current flowing to the control terminal 10, as previously described. In order to overcome the drawbacks of the circuit arrangements shown in FIGS. 2 and 3, a circuit shown in FIG. 4 can be conceived. In this circuit arrangement the input and output amplifiers 1 and 2 appear to be properly controlled to provide a good power efficiency. However, the transistor 9 is completely saturated, so that the transistor 8 comes close to the cut-off state at a base current of the transistor 9 (i.e., collector current of the transistor 8) which brings this transistor 9 into active state. As a result, the conditions for a decrease in the output are already satisfied. Therefore, the current at a very small output is substantially the same as that in the circuit arrangement in FIG. 3. Even if resistors are arranged to control the operating points of the transistors 8 and 9, much improvement cannot be expected.

As described above, according to the conventional methods, the control current is increased at the maximum output, thereby degrading the efficiency. The decrease in DC current is slight when the output is set to be lower than the maximum output, thereby degrading the efficiency. These two drawbacks cannot both be improved at the same time, even if one of them can be improved.

SUMMARY OF THE INVENTION

The present invention has been made in consideration of the conventional drawbacks described above, and has for its object to eliminate these conventional drawbacks and to provide a new and improved output power control circuit wherein an excessive control current does not flow at a maximum output and at the same time the power efficiency will not be greatly degraded at a low output.

In order to achieve the above and other objects of the present invention, there is provided an output power control circuit for a power amplifier circuit having an input amplifier and an output amplifier connected in series with the input amplifier, comprising:

a first transistor, having a first electrode connected to a direct current power supply and a second electrode connected to a power supply terminal of the output amplifier;

a second transistor having a first electrode connected to a third electrode of the first transistor and a second electrode connected to a power supply terminal of the input amplifier; and at least one diode connected between the direct current power supply and the power supply terminal of the input amplifier.

According to the output power control circuit of the present invention, the first and second transistors are connected in the same manner as the transistors 8 and 9 of the conventional power control circuit shown in FIG. 4. However, the diode is arranged in the manner described above, so that an output from the input transistor (input to the output transistor) will not decrease below a predetermined level. As a result, the output can be decreased without degrading the efficiency of the output amplifier greatly.

BRIEF DESCRIPTION OF THE DRAWINGS

FIGS. 7 to 10 are circuit diagrams of power control circuits according to first to fourth embodiments of the present invention.

DETAILED DESCRIPTION OF THE PREFERRED EMBODIMENTS

Figure 1:
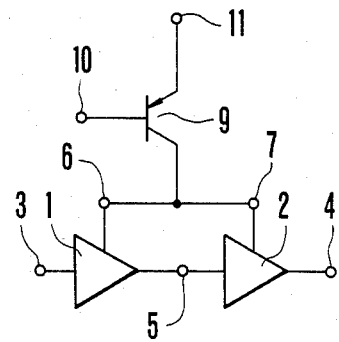
FIGS. 1 to 4 are circuit diagrams of conventional power control circuits of a power supply control type, respectively.
Figure 2:
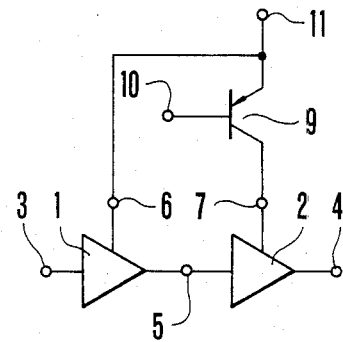
Figure 3:
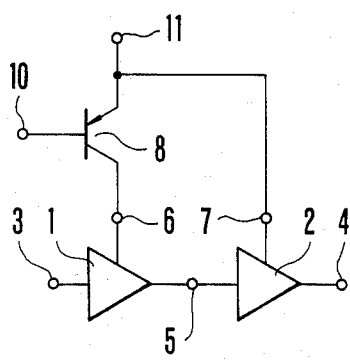
Figure 4:
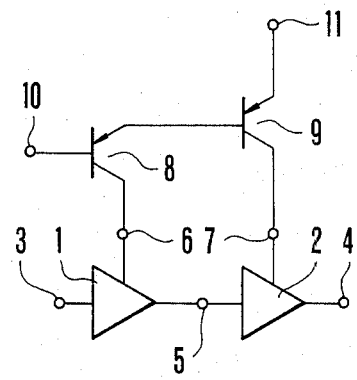
Figure 5A:
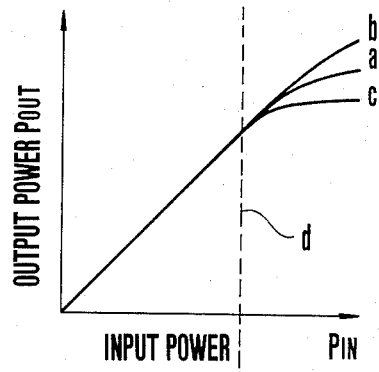
FIGS. 5A through 5C show graphs respectively explaining the output power as a function of the input power, the DC current as a function of the input power, and the power efficiency as a function of the input power when the power supply voltage is kept constant and the input power changes.
Figure 6A:
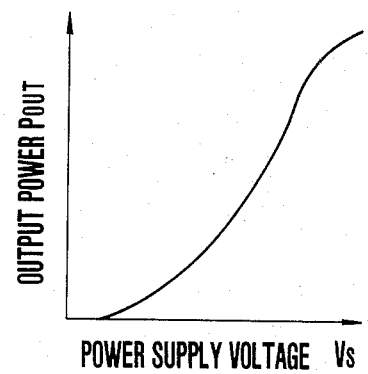
FIGS. 6A through 6C show graphs respectively explaining the output power as a function of the power supply voltage, the DC current as a function of the power supply voltage, and the power efficiency as a function of the power supply voltage when the power supply voltage changes and the input power is kept constant.
Figure 5B:
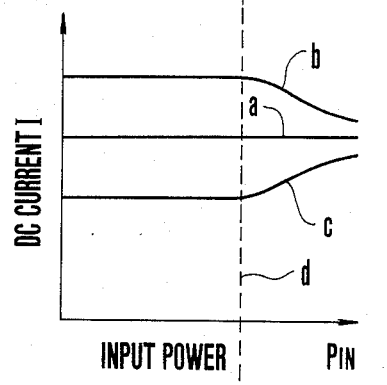
Figure 6B:
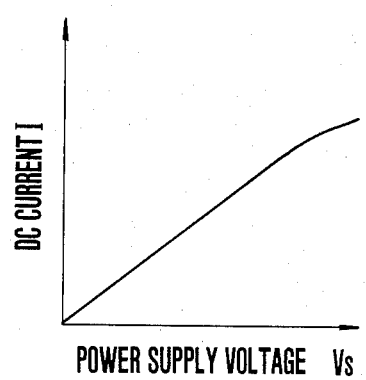
Figure 5C:
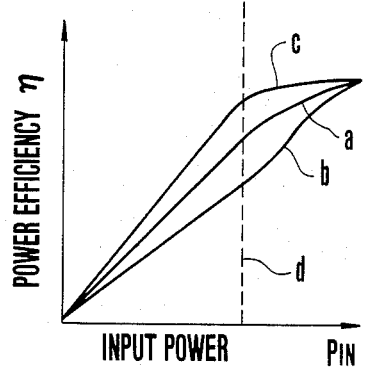
Figure 6C:
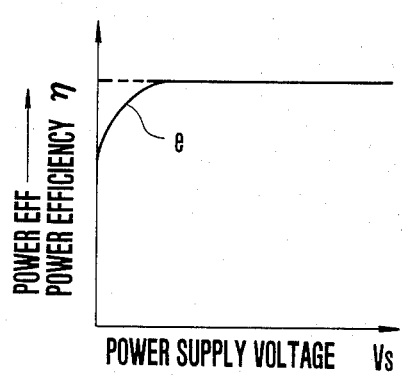

First to fourth preferred embodiments of the present invention will be described with reference to FIGS. 7 to 10, respectively. In these circuits, resistors or the like for controlling the operating points of power control transistors 8 and 9 are omitted for simplicity of description.

FIG. 7 is a circuit diagram of an output power control circuit according to a first embodiment. Referring to FIG. 7, reference numeral 12 denotes a diode added according to teachings of the present invention. When a maximum output is generated, the control transistors 8 and 9 are both saturated, so that a voltage $V_6$ at a power supply terminal 6 of an input amplifier 1 is given as follows:

$$V_6 = V_s - V_{BE9} - V_{CE8}$$

where $V_s$ is a DC power supply voltage, $V_{BE9}$ is the base-emitter voltage of the transistor 9, and $V_{CE8}$ is the collector-emitter voltage of the transistor 8. A forward drop voltage $V_{F12}$ of the diode 12 is selected such that, at the maximum output:

$$V_{F12} > V_{BE9} + V_{CE8} \tag{3}$$

Under this condition, most of the current for the input amplifier 1 will be obtained from the transistor 8. Subsequently, when a current flowing to a control terminal 10 is controlled so that the current flowing through the transistor 8 is decreased, the voltage $V_6$ decreases, and the following relation is given:

$$V_{F12} < V_{BE9} + V_{CE8} \qquad (4).$$

In this case, a current abruptly flows through the diode 12. Thereafter, the input amplifier 1 is operated in accordance with a given operating state determined by the electrical characteristics of the diode 12 and the power supply voltage characteristic of the input amplifier 1. A decrease in the current at the control terminal 10 decreases the current flowing through the transistor 8. As a result, a current flowing through the transistor 9 decreases, thereby ensuring the power control of the output transistor 9. In other words, at a low output, the current flowing through the diode 12 assures a given current input to the output amplifier 2. Consequently, unlike the conventional circuit, extreme efficiency degradation can be prevented.

In general, $V_{BE9} >> V_{CE8}$ and hence $V_{F12} > V_{BE9}$ must be held for satisfying inequality (3) when the transistors 8 and 9 are saturated. However, when the diode 12 comprises a silicon diode, the condition $V_{F12} \simeq V_{BE9}$ is given. In order to satisfy inequality (3), two diodes 13 can be used according to the second embodiment shown in FIG. 8. The number of diodes is not limited to two, but may be extended to three or more to obtain the expected result, thought the voltage $V_6$ at which current flow into the diodes begins changes.

According to the third embodiment (FIG. 9) or the fourth embodiment (FIG. 10), a resistor 14 is arranged to protect an output amplifier 2 from efficiency degradation with the current of the input amplifier 1 minimized.

Referring to FIG. 10, a switch 15 is arranged to instantaneously cut off the current flowing through the power amplifier and the output power control circuit. The switch 15 may comprise a mechanical or electronic switch. Reference numeral 16 denotes a circuit for controlling current at a control terminal 10. When the switch 15 is opened, all the circuit components shown in FIG. 10 are disconnected.

In the circuit arrangements shown in FIGS. 7 to 10, the DC power sources are given to be positive. A negative DC power may also be used. In this case, the control transistors 8 and 9 comprise NPN transistors in place of PNP transistors, and the biasing direction of the diode is reversed, thereby obtaining the same result.

In the above embodiments, each of the preceding and succeeding amplifiers 1 and 2 comprises a single amplifier circuit but may comprise a plurality of amplifiers, if desired.

Figure 11:
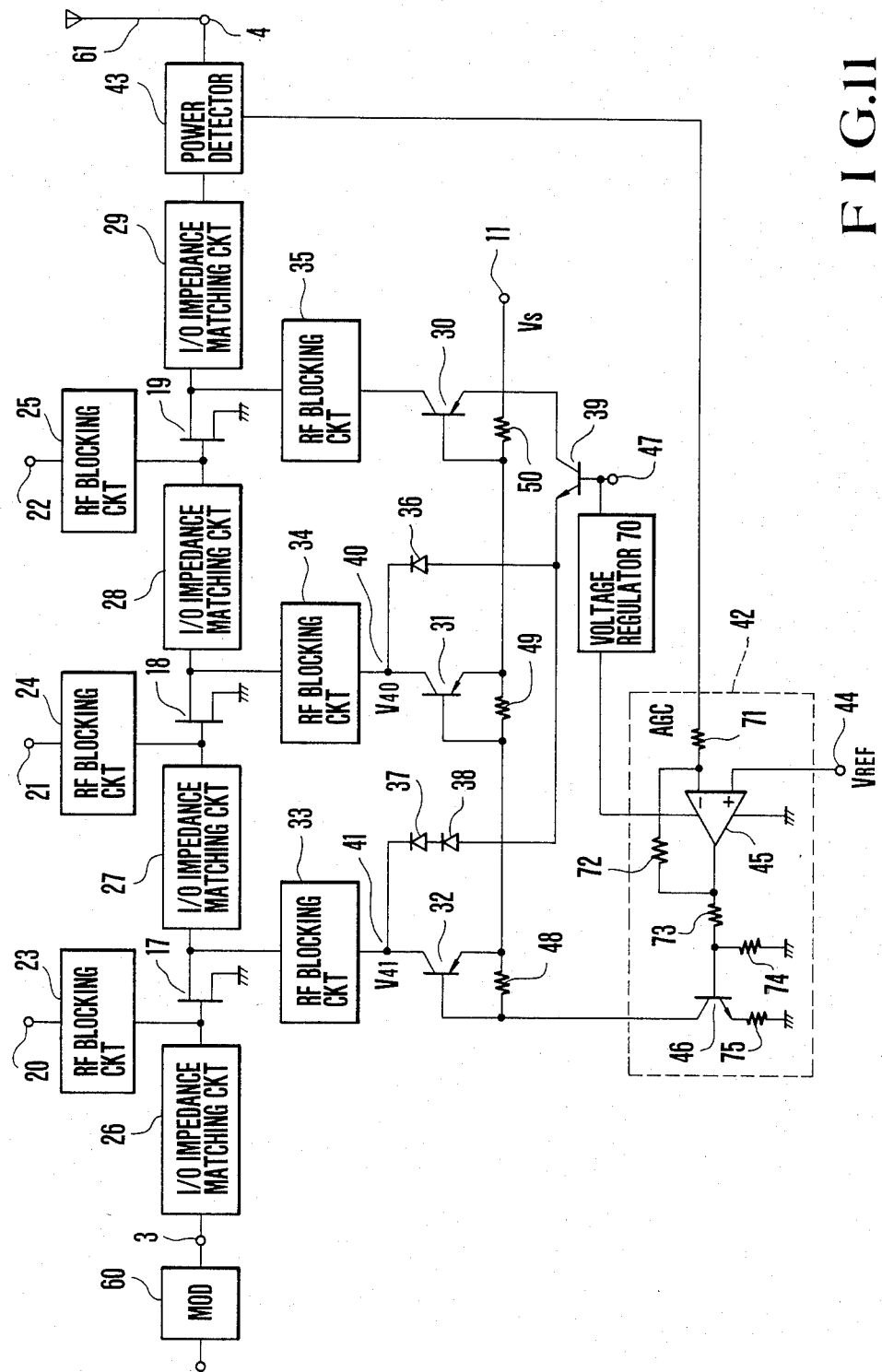
FIG. 11 is a diagram of a UHF power amplifier circuit as an application of the present invention, in which three MESFETs (Metal Semiconductor Field Effect Transistors) as amplifier elements are connected in series with each other.

A practical circuit to which the present invention is applied is exemplified and described with reference to FIG. 11. Exemplified in FIG. 11 is a UHF power amplifier including three MESFETs connected in series with each other. Schematically, in the previous embodiments, the input and output amplifiers, two in all, are connected in series with each other. However, the present invention can also be applied to a series circuit of three amplifiers or more.

Referring to FIG. 11, reference numerals 17, 18 and 19 denote FETs (e.g., GaAs MESFETs) serving as power amplifier elements, respectively. In general, each high power RF GaAs MESFET comprises a depletion FET. A depletion FET may be operated in a class A, class AB or equivalent mode wherein a predetermined DC current flows in the absence of an input signal, and the present invention can be effectively applied when the depletion FET is used. Reference numerals 20, 21 and 22 denote gate bias terminals for rendering the FETs 17, 18 and 19 operative in the aforementioned mode, respectively. Reference numerals 23, 24 and 25 denote RF blocking circuits, respectively; and 26, 27, 28 and 29, input/output impedance matching circuits for the FETs, respectively. A transistor 30 corresponds to the transistor 9 (FIG. 10), and transistors 31 and 32 correspond to the transistor 8 (FIG. 10). Identical reference numerals denote identical elements in FIGS. 7 to 10. The power supply voltage $V_s$ applied to the power supply terminal 11 is controlled by the transistors 30, 31 and 32 and is applied as drain voltage to the FETs 17, 18 and 19 respectively through RF blocking circuits 33, 34 and 35. The biasing direction of the transistors 30, 31 and 32 is determined such that the base current of the transistor for controlling the output amplifier flows in the emitter of the input amplifier. With this connection, when the transistors 30, 31 and 32 are completely saturated, the current will not be wasted. A diode 36 corresponds to the diode 12 (FIG. 7) and diodes 37 and 38 correspond to the diodes 13 (FIGS. 8, 9 and 10), respectively. An NPN transistor 39 corresponds to the switch 15 (FIG. 10) to turn on or off the circuit. The NPN transistor 39 further serves to use a saturation voltage of the collector/emitter path thereof to provide the same effect as the forward bias voltages of the diodes 36, 37 and 38. To be specific, when a voltage $V_{40}$ at a node 40 is reduced below the power supply voltage $V_s$ by a sum of a voltage $V_{CE}$ of the transistor 39 and a forward bias voltage $V_F$ of the diode 36, the voltage $V_{40}$ does not become lower than the resultant voltage $V_s - (V_{CE} + 2V_F)$, so that the FET 18 continues to operate in the given operating state. Similarly, a voltage $V_{41}$ at a node 41 does not become lower than a voltage $V_s - (V_{CE} + 2V_F)$, so that the FET 17 continues to operate in the given operating state. Therefore, the RF input level of the FET 19 will not become lower than the predetermined level, so that the transistor 30 through which the maximum current flows controls the gain of the amplifier. Consequently, even at a low output, the efficiency will not be greatly degraded as described previously. The circuit shown in FIG. 11 also includes component circuits necessary for transmitter operation, in addition to the basic circuit arrangement described above. Reference numeral 42 denotes an automatic gain control (AGC) device for automatically setting the gain of the amplifier even if the frequency or power supply voltage changes. A DC voltage resulting from conversion of output power by a power detector 43 is compared at an operational amplifier 45 with a reference voltage $V_{REF}$ on a terminal 44, and a difference signal is amplified to drive a transistor 46. The transistor 46 then controls the base current of the transistor 32 which in turn controls the transistors 31 and 30. Eventually, the negative feedback gain control of the amplifier circuit as a whole is performed. Various modifications of the AGC can be made, and a typical example thereof is illustrated in FIG. 11. In this arrangement, by disconnecting the power supply to the operational amplifier 45 and turning off the transistor 39, the entire circuit current can be cut off. This function is very effective when a capacity-limited power supply such as batteries or the like is used. It will be noted that reference numeral 47 denotes a control terminal for turning on/off the transistor 39; and 48, 49 and 50, resistors for determining the operating conditions of the corresponding transistors. The control terminal 47 is also connected to the power supply terminal of the operational amplifier 45 through a voltage regulator 70. Reference numerals 71 to 75 denote resistors constituting the AGC device 42 together with the operational amplifier 45 and the transistor 46. A modulator 60 is connected to the input terminal 3, and an antenna 61 is connected to the output terminal 4.

As has been apparent from the above description, the base current of the transistor 9 flows as the collector current of the transistor 8 (as part of the circuit current of the input amplifier), so that the control current can be small at the maximum output. Furthermore, even when the output is set to be lower than the maximum output, the power efficiency will not be degraded due to the diode 12 or the diodes 13, thereby overcoming the conventional drawbacks.

What is claimed is:

1. An output power control circuit for a power amplifier comprised of an input amplifier for reception of an input signal having a power supply terminal and an output amplifier for delivery of a power output signal also having a power supply terminal, said input and output amplifiers being connected in series, said control circuit comprising:
    a DC power supply;
    at least first and second transistors, said first transistor being operative to supply power from said DC power supply to the power supply terminal of said output amplifier, said second transistor being operative to supply power from said DC power supply to the power supply terminal of said input amplifier and responsive to an external current control signal for controlling the supply of power to said input amplifier;
    means for passing the base current of said first transistor as part of the power supply current of said input amplifier to minimize the current value of the current control signal at a maximum output; and
    means connected between said DC power supply and said power supply terminal of input amplifier, for preventing degradation of power efficiency when the output is set to be lower than the maximum output.

2. An output power control circuit according to claim 1 further comprising switching means connected in series with said preventing means.

3. An output power control circuit for a power amplifier having a preceding amplifier and a succeeding amplifier connected in series therewith, comprising:
    a DC power supply;
    a first transistor having a first electrode connected to the DC power supply and a second electrode connected to a power supply terminal of said succeeding amplifier;
    a second tansistor having a first electrode connected to a third electrode of said first transistor and a second electrode connected to a power supply terminal of said preceding amplifier, said second transistor being responsive through its third electrode to an external control current signal to control current flow to said preceding amplifier; and
    at least one diode connected between said DC power supply and said power supply terminal of said preceding amplifier.

4. An output power control circuit according to claim 3 further comprising a resistor, connected between said DC power supply and said at least one diode, for decreasing the current of said preceding amplifier without degrading power efficiency of said succeeding amplifier.

5. An output power control circuit according to claim 3 further comprising a switch connected between said DC power supply and said at least one diode, for instaneously cutting off the current of said output power control circuit.

6. An output power control circuit according to claim 3 wherein said first, second and third electrodes are emitter, collector and base, respectively.

7. An output power control circuit according to claim 6, wherein said at least one diode has an ON voltage higher than a sum of a base-emitter voltage of said first transistor and a collector-emitter voltage of said second transistor at a maximum output of said circuit, said at least one diode being rendered conductive when the ON voltage becomes lower than the sum of the base-emitter voltage and the collector-emitter voltage.

8. An output power control circuit according to claim 3, wherein said preceding and succeeding amplifiers respectively comprise depletion metal semiconductor field effect transistors.

* * * * *